(12) United States Patent
Ding et al.

(10) Patent No.: US 8,455,351 B2
(45) Date of Patent: Jun. 4, 2013

(54) METHOD OF FORMING AN INTEGRATED CIRCUIT INTERCONNECT STRUCTURE

(75) Inventors: Hanyi Ding, Colchester, VT (US); Ronald G. Filippi, Wappingers Falls, NY (US); Jong-Ru Guo, Fishkill, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/531,015

(22) Filed: Jun. 22, 2012

(65) Prior Publication Data

US 2012/0264289 A1 Oct. 18, 2012

Related U.S. Application Data

(62) Division of application No. 12/760,594, filed on Apr. 15, 2010, now Pat. No. 8,237,286.

(51) Int. Cl.
*H01L 21/768* (2006.01)

(52) U.S. Cl.
USPC ..... 438/637; 438/638; 438/622; 257/E21.577

(58) Field of Classification Search
USPC .................................. 438/637–640, 622–624
See application file for complete search history.

(56) References Cited

U.S. PATENT DOCUMENTS

| | | | |
|---|---|---|---|
| 5,470,788 A | 11/1995 | Biery et al. | |
| 5,689,139 A | 11/1997 | Bui et al. | |
| 5,712,510 A | 1/1998 | Bui et al. | |
| 6,552,434 B2 | 4/2003 | Hasunuma et al. | |
| 6,992,002 B2 | 1/2006 | Dunham et al. | |
| 7,458,053 B2 | 11/2008 | Ruderer et al. | |
| 7,501,690 B2 | 3/2009 | Erturk et al. | |
| 8,089,160 B2 | 1/2012 | Wang et al. | |
| 2006/0160354 A1 | 7/2006 | Zhang et al. | |
| 2007/0013072 A1* | 1/2007 | Ellis-Monaghan et al. | .. 257/758 |
| 2008/0203589 A1 | 8/2008 | Bailey et al. | |
| 2009/0020830 A1 | 1/2009 | Anderson et al. | |
| 2009/0152724 A1 | 6/2009 | Wang et al. | |
| 2010/0159693 A1 | 6/2010 | Liu et al. | |
| 2011/0175226 A1 | 7/2011 | Bonilla et al. | |
| 2011/0254168 A1 | 10/2011 | Ding et al. | |

OTHER PUBLICATIONS

I.A. Blech, "Electromigration in thin aluminum films on titanium nitride", Journal of Applied Physics, Apr. 1976, pp. 1203-1208, vol. 47, No. 4, American Institute of Physics.

(Continued)

*Primary Examiner* — Thanh Nguyen
(74) *Attorney, Agent, or Firm* — Cantor Colburn LLP; Catherine Ivers (57) ABSTRACT

An integrated circuit (IC) interconnect structure that includes a first via positioned in a dielectric and coupled to a high current device at one end, and a buffer metal segment positioned in a dielectric and coupled to the first via at an opposite end thereof. The buffer metal segment includes a plurality of electrically insulating inter-dielectric (ILD) pads forming an ILD cheesing pattern thereon, to direct current. The IC interconnect structure further includes a second via positioned in a dielectric formed over the buffer metal segment and coupled to the buffer metal segment at one end and a metal power line formed in a dielectric and coupled to the second via at an opposite end thereof. The use of the ILD pads on the buffer metal segment enables a more even distribution of current along the metal power line.

6 Claims, 5 Drawing Sheets

OTHER PUBLICATIONS

C.-K. Hu et al; "Electromigration of Cu/low Dielectric Constant Interconnects;" Microelectronics Reliabilty, Jul. 12, 2005, pp. 1-19.
J. Lienig, "Interconnect and current density stress: an introduction to electromigration-aware design", SLIP' 05, 2005, pp. 81-88.
C.-K. Hu et al.; "Electromigration Reliability in Nanoscale Cu Interconnects;" MSR Fall 2007; 1 pg.
R. Otten et al., "Design Automation for Deepsubmicron: Present and Future", Proc. Conf. on Design, Automation and Test in Europe, 2002, pp. 650-657. IEEE.
Wang et al., "Electromigration threshold in copper interconnects", Applied Physics Letters, Jun. 2001, pp. 3598-3600, vol. 78, No. 23, American Institute of Physics.

* cited by examiner

METHOD OF FORMING AN INTEGRATED CIRCUIT INTERCONNECT STRUCTURE

CROSS-REFERENCE TO RELATED APPLICATION

This application is a divisional of U.S. patent application Ser. No. 12/760,594, filed Apr. 15, 2010, now U.S. Pat. No. 8,237,286, the disclosure of which is incorporated by reference herein in its entirety.

BACKGROUND

The present invention relates to integrated circuits (ICs), and more specifically, to an IC interconnect structure having high reliability.

Back-end-of-line (BEOL) interconnects carry high direct current (DC) in advanced integrated circuit (IC) chip technology. The design of BEOL interconnects becomes more challenging in advanced technologies. As IC chip technology advances, self-heating by high current devices raises the temperature of nearby interconnects under circuit operation and makes use of high current carrying BEOL interconnects more challenging. For example, a device that uses high current may heat up an interconnect that is coupled to the device. The high current may cause electromigration degradation of the interconnect (via and/or line), causing shorts or opens. Typically, the above-described problem has been circumvented by widening the interconnect carrying the high current. However, severe current crowding may still exist at the via/line contact interface which is susceptible to electromigration damage.

SUMMARY

Embodiments of the present invention provide an IC interconnect structure for a high current device that reduces current crowding at a metal layer, to thereby prevent electromigration damage. A design structure and a method for forming the IC interconnect structure are also provided.

According to one embodiment of the present invention, an integrated circuit (IC) interconnect structure is provided. The IC interconnect structure includes a first via positioned in a dielectric and coupled to a high current device at one end, and a buffer metal segment positioned in a dielectric and coupled to the first via at an opposite end thereof. The buffer metal segment includes a plurality of electrically insulating inter-dielectric (ILD) pads forming a ILD cheesing pattern thereon, to direct current. The IC interconnect structure further includes a second via positioned in a dielectric formed over the buffer metal segment and coupled to the buffer metal segment at one end and a metal power line formed in a dielectric and coupled to the second via at an opposite end thereof.

According to another embodiment of the present invention, a design structure embodied in a machine readable medium for designing, manufacturing, or testing an integrated circuit is provided. The design structure includes an IC interconnect including a first via positioned in a dielectric and coupled to a high current device at one end and a buffer metal segment positioned in a dielectric and coupled to the first via at an opposite end thereof. The buffer metal segment includes a plurality of electrically insulating inter-dielectric (ILD) pads forming a ILD cheesing pattern thereon, to direct current. The IC interconnect further includes a second via positioned in a dielectric formed over the buffer metal segment and coupled to the buffer metal segment at one end, and a metal power line formed in a dielectric and coupled to the second via at an opposite end thereof.

According to yet another embodiment of the present invention, a method is provided. The method includes forming a high current device, forming a first via positioned in a dielectric and coupled to the high current device at one end, forming a buffer metal segment positioned in a dielectric and coupled to the first via at an opposite end thereof, and forming a plurality of electrically insulating inter-dielectric (ILD) pads forming a ILD cheesing pattern on the buffer metal segment, to direct current. The method further includes forming a second via positioned in a dielectric formed over the buffer metal segment and coupled to the buffer metal segment at one end and forming a metal power line in a dielectric and coupled to the second via at an opposite end thereof.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
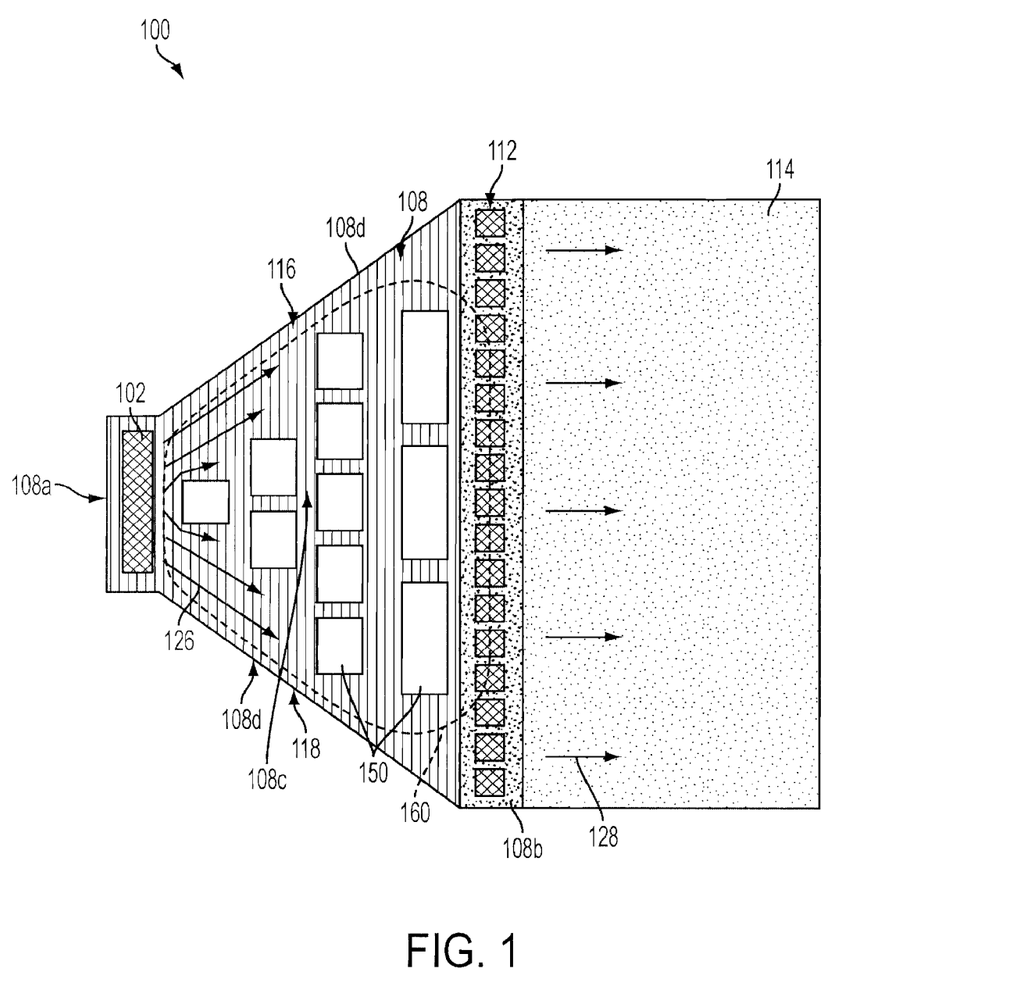
FIG. 1 is a diagram illustrating a top view of an IC interconnect structure that can be implemented within embodiments of the present invention.
Figure 2:
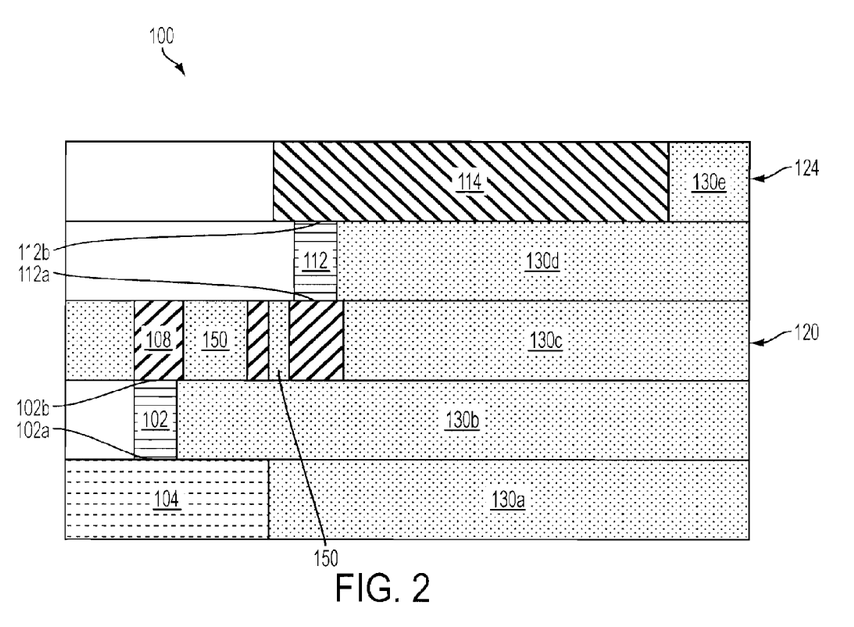
FIG. 2 is a diagram illustrating a cross-sectional view of the IC interconnect structure shown in FIG. 1.

FIGS. 1 through 4 illustrate integrated circuit (IC) interconnect structures according to various embodiments of the present invention. Referring to FIGS. 1 and 2, FIG. 1 is a diagram illustrating a top view of an IC interconnect structure that can be implemented within embodiments of the present invention, while FIG. 2 is a diagram illustrating a cross-sectional view of the IC interconnect structure shown in FIG. 1. As shown in FIGS. 1 and 2, an IC interconnect structure 100 is provided. The IC interconnect structure 100 includes a first via 102 positioned in a dielectric 130b and coupled to a high current device 104 in a dielectric 130a at one end 102a, and a buffer metal segment 108 positioned in a dielectric 130c and coupled to the first via 102 at an opposite end thereof 102b. The high current device 104 may include for example, a transistor, resistor, on-chip heater or any other device used in an IC that requires high power (e.g., greater than 5 milliwatts (mW)). The high current device 104 may be a front-end-of-line (FEOL) level structure or the IC interconnect structure 100 may be applied at any back-end-of-line (BEOL) layer.

The IC interconnect structure 100 further includes at least one second via 112 positioned in a dielectric 130d formed over the buffer metal segment 108 and coupled to the buffer metal segment 108 at one end 112a and a metal power line 114 formed in a dielectric 130e and coupled to the second via 112 at an opposite end thereof 112b.

According to an embodiment of the present invention, the buffer metal segment 108 is significantly shorter in length than the metal power line 114. Also, the buffer metal segment 108 is also equal or shorter in length than the "Blech length," so that the metal line is benefited from the "short-length effect" and is immune to electromigration because the electromigration force is balanced by a stress-induced back-flow of atoms. See I. A. Blech, J. Appl. Phys. 47, 1203 (1976). A Blech length, or $L_{Blech}$, of a conductive material is generally determined by the equation of $L_{Blech}=(jL)_{th}/j$, wherein $(jL)_{th}$ is the Blech threshold of the conductive material, and j is a current density passing through the conductive material in a direction where the Blech length is measured. For most conductive materials including Cu, Au, Ag, and Al, $(jL)_{th}$ is a constant known in the art. For example, the Blech threshold $(jL)_{th}$ is typically approximately 200 milliamp per micrometer (mA/μm) for copper. The current density can be measured, for example, in a unit of milliamp per micrometer square (mA/μm$^2$). Therefore, for a current density of for example 20 mA/μm$^2$ passing through the buffer metal segment 108 consisting essentially of copper, the Blech length may typically be found at approximately 10 micrometers (μm), while the metal power line 114 may be approximately 100 micrometers (μm) to carry current over distance.

The buffer metal segment 108 is a short interconnect segment between the first via 102 and the metal power line 114 and acts as a "buffer" for transporting high current so that the interconnect directly contacting the high current device 104 is protected from electromigration damage based on a short-length benefit and buffers the device 104 heating and reduces the temperature in the metal power line 114.

Further, as shown in FIG. 1, the buffer metal segment 108 includes a portion having non-parallel sides 116 and 118 wherein a width of the buffer metal segment 108 varies from one end 108a to an opposite end thereof 108b.

According to an embodiment of the present invention, the buffer metal segment 108 is positioned in a first metal layer 120 of the IC and the metal power line 114 is positioned in a second metal layer 124 of the IC.

According to an embodiment of the present invention, the metal buffer segment 108 and the metal power line 114 may be formed of copper (Cu) or aluminum (Al), for example. The dielectrics 130a~130d may include silicon, substrate, packaging substrate, silicon nitride (Si3N4), silicon oxide (SiO2), fluorinated SiO2 (FSG), hydrogenated silicon oxycarbide (SiCOH), porous SiCOH, bor-phoso-silicate glass (BPSG), silsesquioxanes, carbon (C) doped oxides that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available form JSR Corporation), other low dielectric constant (<3.9) material, or layers thereof, for example. According to an embodiment of the present invention, each dielectric of 130a~130e may be formed of a different material.

According to an embodiment of the present invention, the buffer metal segment 108 includes a plurality of electrically insulating inter-dielectric (ILD) pads 150 forming a ILD cheesing pattern 160 thereon, to direct current. According to an embodiment of the present invention, the plurality of electrically insulating ILD pads 150 are formed of variable shapes and/or variable density. Also, the plurality of electrically insulating ILD pads 150 may be part of the dielectric 130c, and they may be formed during the formation of the buffer metal segment 108.

According to another embodiment of the present invention, as shown in FIG. 1, the ILD cheesing pattern 160 is formed non-uniformly such that a density thereof is higher at a center region 108c of the buffer metal segment 108 and lower near edge portions 108d along the non-parallel sides 116 and 118.

The buffer metal region 108 separates the metal power line 114 from the first via 102 contacting the high current device 104, so that it relaxes the current density and temperature in the metal power line 114. The IC interconnect structure 100 reduces local hot spot formation from the high current device 104 within the metal power line 114. The IC interconnect structure 100 also spreads current density distribution in the metal power line 114 as shown in FIG. 1. Therefore, current crowding is avoided in the buffer metal segment 108 and the metal power line 114. As indicated by arrows 126, current is diverted closer to the edges 108d of the buffer metal segment 108 such that it is diverted more uniformly when entering the metal power line 114 as indicated by arrows 128.

Figure 3:
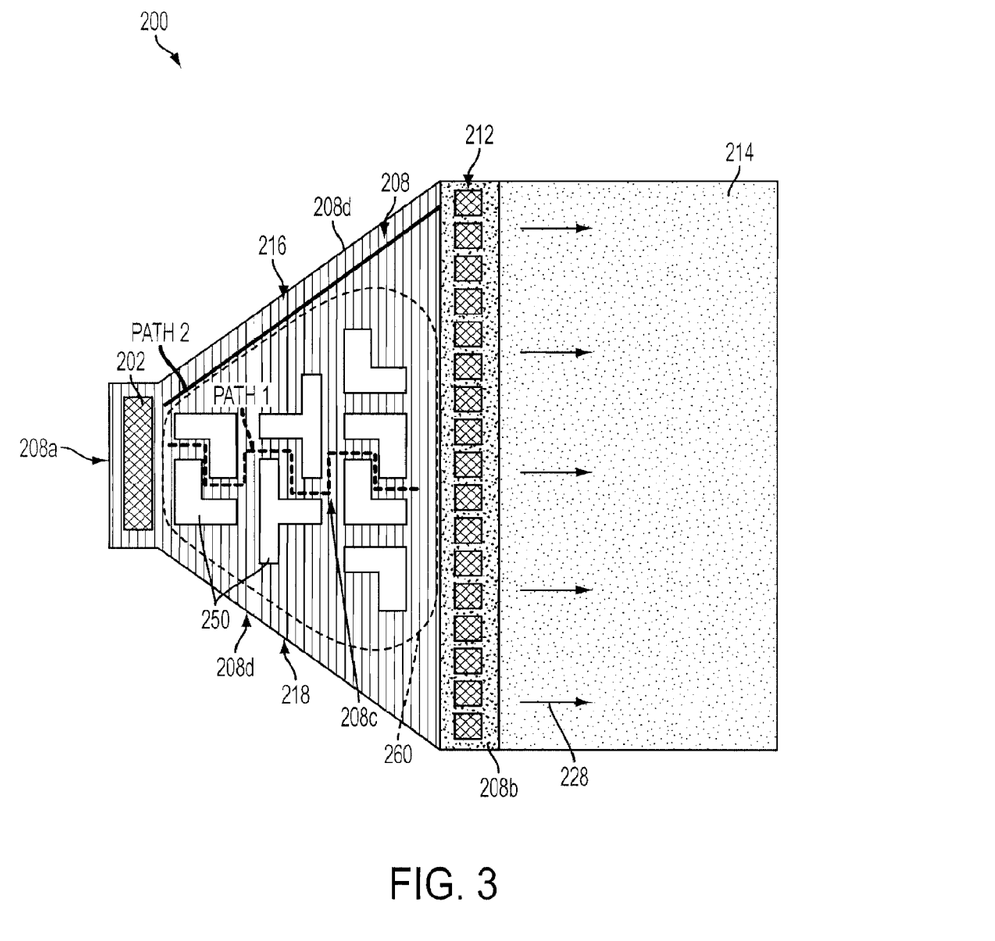
FIG. 3 is a diagram illustrating a top view of an IC interconnect structure that can be implemented within alternative embodiments of the present invention.
Figure 4:
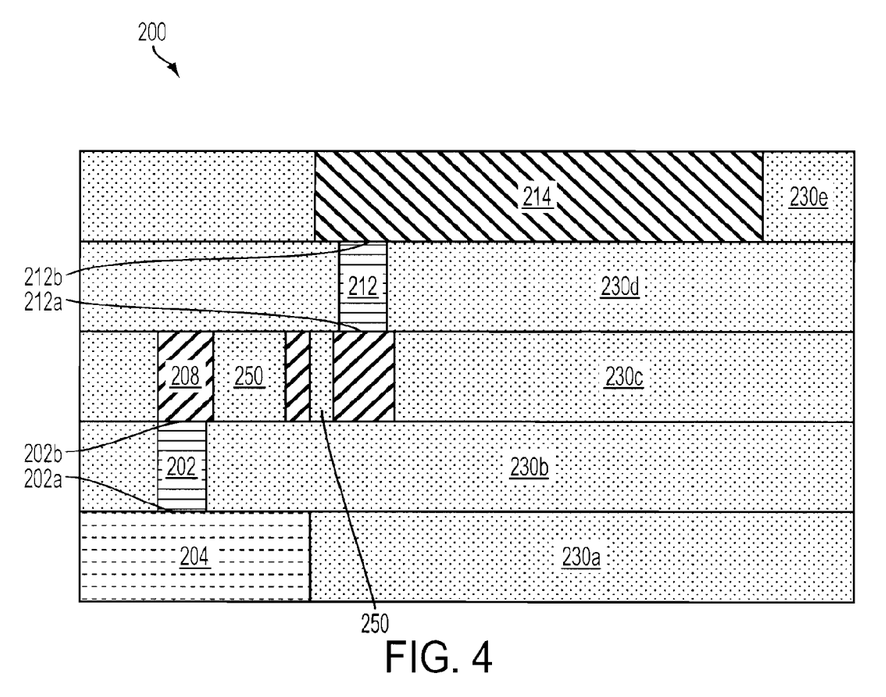
FIG. 4 is a cross-sectional view of the IC interconnect structure shown in FIG. 3.

As mentioned above, the ILD pads 150 may be formed of variable shapes and/or density. FIG. 3 is a diagram illustrating a top view of an IC interconnect structure that can be implemented within alternative embodiments of the present invention. FIG. 4 is a cross-sectional view of the IC interconnect structure shown in FIG. 3. As shown in FIGS. 3 and 4, an IC interconnect structure 200 is provided. The IC interconnect structure 200 includes a first via 202 positioned in a dielectric 230b and coupled to a high current device 204 in a dielectric 230a at one end 202a, and a buffer metal segment 208 positioned in a dielectric 230c and coupled to the first via 202 at an opposite end thereof 202b.

The IC interconnect structure 200 further includes at least one second via 212 positioned in a dielectric 230d formed over the buffer metal segment 208 and coupled to the buffer metal segment 208 at one end 212a and a metal power line 214 formed in a dielectric 230e and coupled to the second via 212 at an opposite end thereof 212b. Further, as shown in FIG. 1, the buffer metal segment 208 includes a portion having non-parallel sides 216 and 218 wherein a width of the buffer metal segment 208 varies from one end 208a to an opposite end thereof 208b.

According to an embodiment of the present invention, the IC interconnect structure 200 further includes ILD pads 250 which form a non-uniform cheesing pattern 260 within the buffer metal segment 208, where an electrically conductive path near a center region 208c thereof is lengthened by forming a zigzag pattern with irregular cheesing shapes of the ILD pads 250. In the current embodiment of the present invention, a first current path i.e., Path 1 formed along the center region 208c of the metal buffer segment 208) has a same length as a second current path, i.e., Path 2 formed along an edge portion 208d of the non-parallel sides 216 and 218. For illustration purposes only, FIG. 3 only shows Path 2 along the non-parallel side 216. As a result, the current in Path 1 is further spread before entering the metal power line 214 such that the current across the width of the metal power line 214 more uniformly distributed as indicated by arrows 228.

Figure 5:
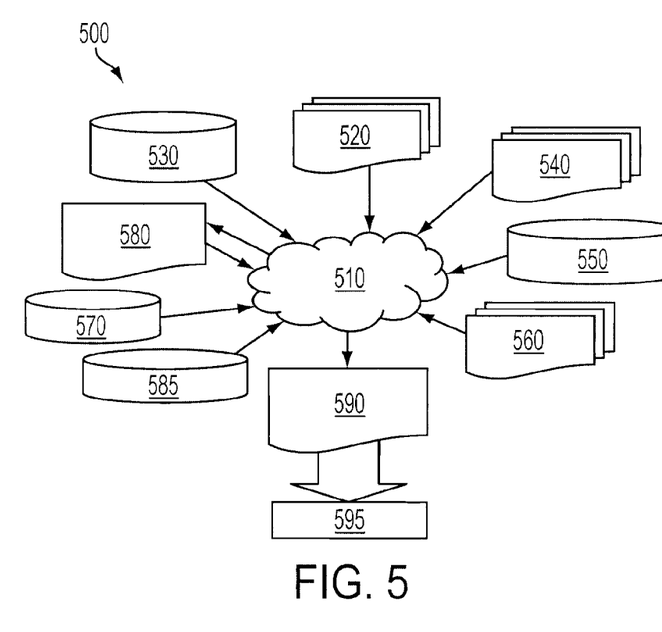
FIG. 5 is a flow diagram of a design process used in semiconductor design, manufacturing and/or test that can be implemented within embodiments of the present invention.

FIG. 5 is a flow diagram of a design process used in semiconductor design, manufacturing and/or test. Specifically, FIG. 5 shows a block diagram of an exemplary design flow 500 used for example, in semiconductor design manufacturing, and/or test. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IP provider, a core developer, or other design company or may be generated by the operator of the design flow, or from other sources. Design structure 520 comprises an embodiment of the disclosure as shown in FIGS. 1-4 in the form of schematics or HDL, a hardware-description language (e.g., Veriolog, VHDL, C, etc). Design structure 520 may be contained on one or more machined readable medium. For example, design structure 520 may be a text file or a graphical representation of an embodiment of the disclosure as shown in FIGS. 1-4. Design process 510 preferably synthesizes (or translates) an embodiment of the present invention as shown in FIGS. 1 through 4 into a netlist 580, where netlist 580 is, for example, a list of lines, transistors, logic gates, control circuits, I/O, models, etc. that describes the connections to other elements and circuits in an integrated circuit design and recorded on at least one of a machine readable medium. This may be an iterative process in which the netlist 580 is re-synthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology (e.g., different technology nodes, 32 nm, 45 nm, 90 nm, etc.), designed specifications 540, characterization data 550, verification data 560, design rules 570, and test data files 585 (which may include test patterns and other testing information). The design process 510 may further include, for example, standard circuit design processes such as timing analysis, verification, design rule checking, place and route operations, etc. One of ordinary skill in the art of IC design can appreciate the extent of possible electronic design automation tools and applications used in design process 510 without deviating from the scope and spirit of the present invention. The design structure of the present invention is not limited to any specific design flow.

Design process 510 preferably translates the embodiments of the present invention as shown in FIGS. 1 through 4, along with any additional IC design or data (if applicable, into a second design structure 590. The design structure 590 resides on a storage medium in a data format used for the exchange of layout data of ICs (e.g., information stored in a GDSII (GDS2), GL1, OASIS, or any other suitable format for storing such design structures). Design structure 590 may include information such as test data files, design content files, manufacturing data, layout parameters, lines, levels of metal, vias, shapes, data for routing through the manufacturing line, and any other data required by a semiconductor manufacturer to produce the embodiments of the present invention as shown in FIGS. 1 through 4. The design structure 590 may then proceed to a stage 595 where, for example, the design structure 590: proceeds to tape-out, is released to manufacturing, is released to a mask house, is sent to another design house, is sent back to the customer, etc.

The method as described above is used in the fabrication of integrated circuit chips, the resulting integrated circuit chips can be distributed by the fabricator in raw wafer form (that is, a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method, comprising:
   forming a high current device;
   forming a first via positioned in a dielectric and coupled to the high current device at one end;
   forming a buffer metal segment positioned in a dielectric and coupled to the first via at an opposite end thereof;
   forming a plurality of electrically insulating inter-dielectric (ILD) pads through buffer metal segment;
   forming a second via positioned in a dielectric formed over the buffer metal segment and coupled to the buffer metal segment at one end; and
   forming a metal power line in a dielectric and coupled to the second via at an opposite end thereof;
   wherein the plurality of ILD pads are configured in a pattern within a perimeter of the buffer metal segment, with the pads having varying shapes and sizes with respect to one another and being arranged at various densities with respect to locations in the buffer metal segment so as to spread current density distribution in the metal buffer segment in a manner that avoids current crowding in the metal buffer segment and in the metal power line.

2. The method of claim 1, wherein the buffer metal segment is formed equal to or shorter than a Blech length and is significantly shorter in length than the metal power line.

3. The method of claim 1, wherein the buffer metal segment is positioned in a first metal layer of the IC and the metal power line is positioned in a second metal layer of the IC.

4. The method of claim 1, further comprising:
   forming the buffer metal segment including a portion having non-parallel sides wherein a width of the buffer metal segment varies from one end to an opposite end thereof.

5. The method of claim 1, wherein the ILD pattern is formed such that a density thereof is higher at a center region of the buffer metal segment.

6. The method of claim 1, wherein the ILD pattern is arranged so as to define a zigzag shaped, electrically conductive path near a center region of the metal buffer section.

* * * * *